United States Patent [19]

Wen et al.

[11] Patent Number: 5,166,648
[45] Date of Patent: Nov. 24, 1992

[54] DIGITAL PHASE SHIFTER APPARATUS

[75] Inventors: Cheng P. Wen, Mission Viejo; David C. Wang, Rancho Palos Verdes; Gerald H. Nesbit, Redondo Beach, all of Calif.

[73] Assignee: The United States of America as represented by the Secretary of the Air Force, Washington, D.C.

[21] Appl. No.: 149,761

[22] Filed: Jan. 29, 1988

[51] Int. Cl.$^5$ ............................................. H03H 11/20
[52] U.S. Cl. ..................................... 333/139; 333/164; 307/262
[58] Field of Search ............... 333/164, 161, 156, 139; 307/262

[56] References Cited

U.S. PATENT DOCUMENTS

| | | | |
|---|---|---|---|
| 4,056,792 | 11/1977 | Horwitz et al. | 333/156 |
| 4,398,161 | 8/1983 | Lamb et al. | 333/156 |
| 4,458,219 | 7/1984 | Vorhaus | 333/164 |
| 4,471,330 | 9/1984 | Naster et al. | 333/164 |
| 4,599,585 | 7/1986 | Vorhaus et al. | 333/164 |
| 4,612,520 | 9/1986 | Boire et al. | 333/161 X |
| 4,647,789 | 3/1987 | Upadhyayula | 307/262 |
| 4,652,883 | 3/1987 | Andricos | 342/372 |

OTHER PUBLICATIONS

Cruz, J. E. and Jellison, J. C.; "A Digital Technique for Generating Variable Frequency Multi-Phase Waveforms"; *The Review of Scientific Instruments*; vol. 41, No. 7; pp. 1098-1099; Jul. 1970.

Primary Examiner—Eugene R. Laroche
Assistant Examiner—Benny Lee
Attorney, Agent, or Firm—William Stepanishen; Donald J. Singer

[57] ABSTRACT

A digital phase shift apparatus having a pair of single gate FETs which are connected in a common source configuration. Transmission line segments which respectively connect the sources and drains of the FET pair, provides a phase shift to an applied RF signal. The operating FET provides signal gain as well as switch the signal path length.

6 Claims, 2 Drawing Sheets

DIGITAL PHASE SHIFTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an RF phase shift apparatus, and in particular to a digital phase shift apparatus.

The state of the art of digital phase shifters is well represented and alleviated to some degree by the prior art apparatus and approaches which are contained in the following U.S. Patents:

U.S. Pat. No. 4,398,161 issued to Lamb et al on Aug. 9, 1983;

U.S. Pat. No. 4,458,219 issued to Vorhaus on Jul. 3, 1984;

U.S. Pat. No. 4,471,330 issued to Naster et al on Sep. 11, 1984;

U.S. Pat. No. 4,599,585 issued to Vorhaus et al on Jul. 8, 1986;

U.S. Pat. No. 4,647,789 issued to Upadhyayula on Mar. 3, 1987; and

U.S. Pat. No. 4,652,883 issued to Andricos on Mar. 24, 1987.

The Lamb et al reference discloses a phase shifting circuit comprising a quadrature hybrid for splitting a source of signals into two paths, with an amplifier in each path and a summing hybrid for recombining the outputs from the amplifiers to produce a resultant signal. Phase shift adjustment is achieved by independently varying the gain control voltage of each amplifier.

The Vorhaus reference illustrates a phase shifter which includes three cascade interconnected phase shift stages. Each stage includes a quadrature coupler and a pair of field effect transistors (FET), having a pair of gates, a drain, and a source, connected in a common (grounded) source configuration. The drain of each FET is coupled to an input port of the quadrature coupler to provide two signal paths having an electrical pathlength difference corresponding to a 90° differential phase shift. In the third stage, a length of transmission line is coupled between a drain of one of the FET's and one input port of the coupler to provide a signal path having an electrical pathlength corresponding to 180° phase shift.

The Naster et al reference discloses a digital phase bit for microwave operation which comprises a pair of FET switches and at least three transmission lines. The FETs when operated in a digital switching mode, present a small impedance when on and a high impedance when off. Each of two of the transmission lines exhibits a series inductive impedance over the operating frequency band and shunts a FET switch, two shunt combinations being interconnected by the third transmission line.

The Vorhaus et al reference discloses a n-bit digitally controlled phase shifter for controlling the phase of an applied signal over the range of 0° to 360° includes n, cascade interconnected phase shifter stages. Each phase shifter stage is formed on a semi-insulating substrate having a pair of field effect transistors and a pair of transmission lines formed therein.

The Upadhyayula reference describes a continuously variable phase shifter for the phase range from 0° to 90°, switchable phase shifters switchable between 0° and 90° and a continuously variable phase shifter for the phase shift range of 0° to 360°. Each of the phase shifters relies on dual gate FET devices to provide the required phase shift in a compact structure while providing sufficient gain to avoid signal losses through the phase shifter.

The Andricos reference describes a radar pulse shifter which includes several phase shift devices whose phase shift angles can be added together, which produces a minimal VSWR and an accurately controllable total phase shift.

Digital phase shifters are essential to phased array radars and communication systems. Digital phase shift is commonly accomplished by path length switching, phase reversal reflection or propagation constant modulation. Typically, PIN switching diodes, varactor diodes or FETs are employed as the switching element to change the phase of an RF signal from one state to another. There is shown in FIGS. 1 through 3 examples of prior art digital phase shift apparatus. Loss of signal strength is a major concern. The circuit attenuation is often compensated by an amplifier external to the phase shifter. An alternative approach is to integrate dual gate FET amplifiers into the phase shifter circuit to provide gain and digital phase shift simultaneously. For example, the circulator coupled PIN diode path length modulator, shown in FIG. 1a, provides 180 phase change when the PIN diode alternates between a forward biased low impedance state to a high impedance reverse bias state. The circulator 100 has three ports, 1, 2 and 3. The switching termination 101 which is connected to port 2 may comprise a PIN diode, an FET or similar switching device. Similar phase shifters can be constructed using a branch line coupler and two PIN diodes as shown in FIG. 1b. The branch line coupler 102 has four ports 1 through 4. Switching terminations 103 are connected to branch line coupler 102 ports 2 and 3. The switching terminations 103 which are connected to ports 2 and 3 may comprise a PIN diode, an FET or similar switching device. A second type of digital phase shifter makes use of the loading along a transmission line to change the propagation constants. An example of the switching load phase shifter is shown in FIG. 2. The characteristic impedance, Zo of load 104 may be changed by utilizing switching units 105, 106. The switching units 105, 106 are respectively connected to impedance B1, B2. The switching units 105, 106 which are connected to the load 104 may comprise a PIN diode, an FET or similar switching device. A third phase shifter type which is shown in FIG. 3, is called a switching line phase shifter because the line length of the signal path is switched, resulting in a change in phase delay. A common feature of these phase shifters is the circuit loss that is associated with the components. A substantial loss in signal strength or system sensitivity can result if multi-bidigital phase shift is required.

A phase shifter with signal gain is highly desirable. One way to accomplish this objective is to insert amplifiers in the phase shifter circuits. Alternatively, transistor amplifiers can be employed as path length switches with gain. The digital phase shifter that is shown in FIG. 4 employs two dual gate FETs connected in a common source configuration. The RF signal is amplified by the first or the second FET depending on which one is cutoff by controlled bias voltages applied to the second gates. The difference in signal path is the distance between the two transistors. The gate electrode must be terminated with a matched load to prevent high VSWR at the line segment connecting the gate electrodes otherwise no net phase shift can be realized.

The common source dual gate FET phase shifter, as shown in FIG. 4, relies on the control voltage which is applied to the second gate to switch the signal path. Substantial signal attenuation is encountered in the connecting delay line section between the two FETs. In addition, the dual gate FET configuration places a heavy burden on the wafer fabrication process control. A substantial reduction in processing yield can be achieved by going from circuits using single gate devices rather than dual gate structures. This gain in processing yield will be especially noticeable if the gate length is in the submicron dimensions.

The present invention provides a low cost, compact integrated phase shifter with signal gain. This digital phase shift apparatus will have particular application in air borne radar, and SDI related microwave and millimeterwave system programs.

SUMMARY OF THE INVENTION

The present invention utilizes a digital phase shifter with net gain at microwave frequencies. The digital phase shifter comprises two single gate FETs which serve both as signal path length switches as well as signal amplifiers. The FETs are operating in a common gate configuration for the RF signal while a low frequency switching signal is superimposed on the RF ground to switch the transistors to either a normal operating mode or a pinch off condition.

It is one object of the present invention, therefore, to provide an improved digital phase shifter apparatus which provides signal gain as well as signal path length switching.

It is another object of the invention to provide an improved digital phase shifter apparatus which utilizes two single gate FETs to switch signal path length.

It is another object of the invention to provide an improved digital phase shifter apparatus which achieves a significant improvement in circuit fabrication yield by using a single gate FET in place of the dual gate devices especially when the gate lengths are submicron in geometry.

It is yet another object of the invention to provide an improved digital phase shifter apparatus having a common gate configuration which results in better input impedance matching when the reciprocal of the FET transconductance (or 1/gm) is approximately equal to the characteristics impedance of the transmission line that is connected to the phase shifter input port.

It it still another object of the invention to provide an improved digital phase shifter apparatus which is compatible with the truly planar low cost monolithic integrated circuit fabrication techniques.

These and other advantages, objects and features of the invention will become more apparent after considering the following description taken in conjunction with the illustrative embodiment in the accompanying drawings.

DETAILED DESCRIPTION OF THE PREFERRED EMBODIMENT

Figure 1A:
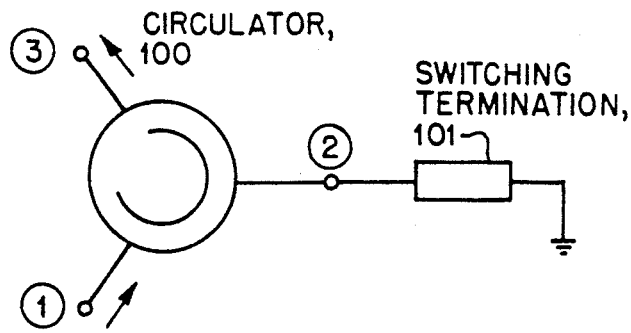
FIG. 1a is a block diagram of a prior art circulator coupled PIN diode path length modulator.
Figure 1B:
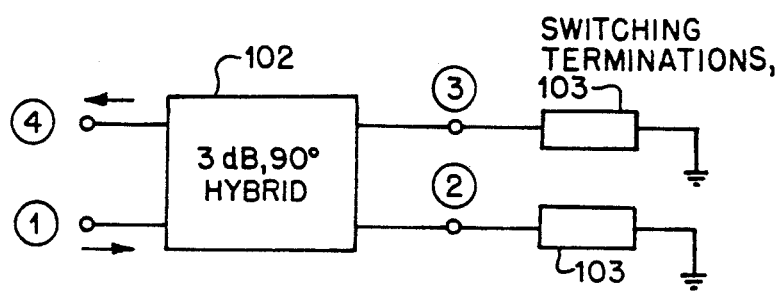
FIG. 1b is a block diagram of a prior art branch line coupled phase modulator.
Figure 2:
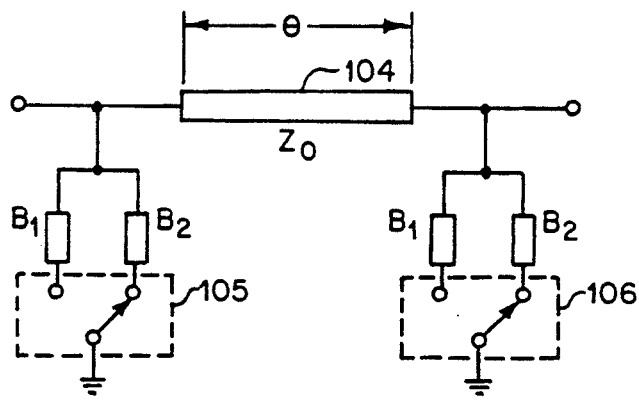
FIG. 2 is a schematic representation of a prior art switching load phase shifter.
Figure 3:
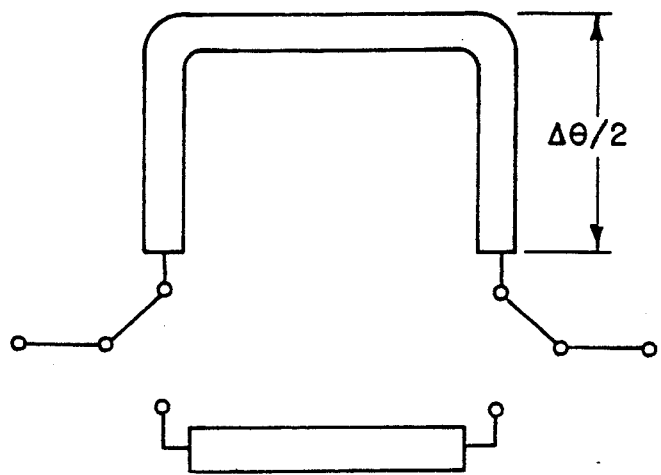
FIG. 3 is a block diagram of a prior art switching line phase shifter.
Figure 4:
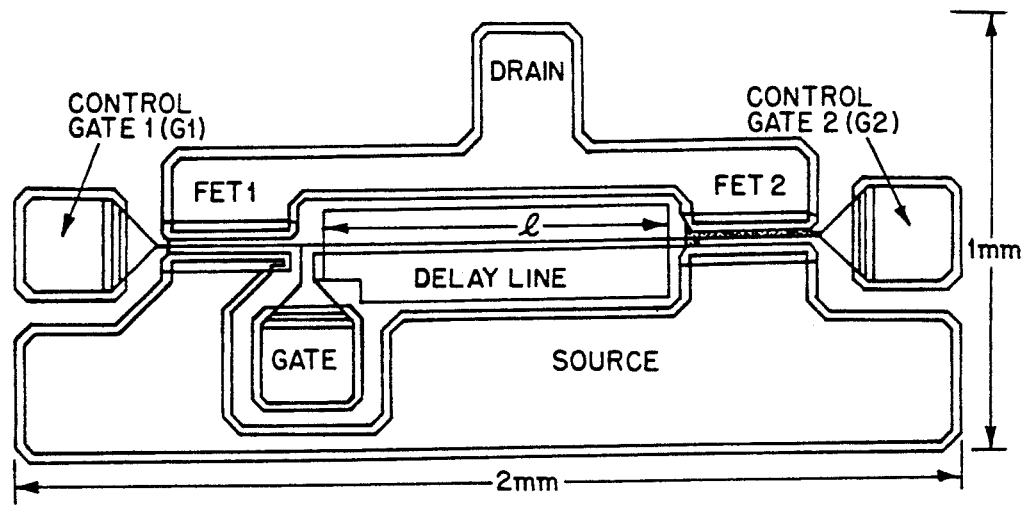
FIG. 4 is a schematic representation of a prior art of a dual gate FET switch path phase shifter.
Figure 5:
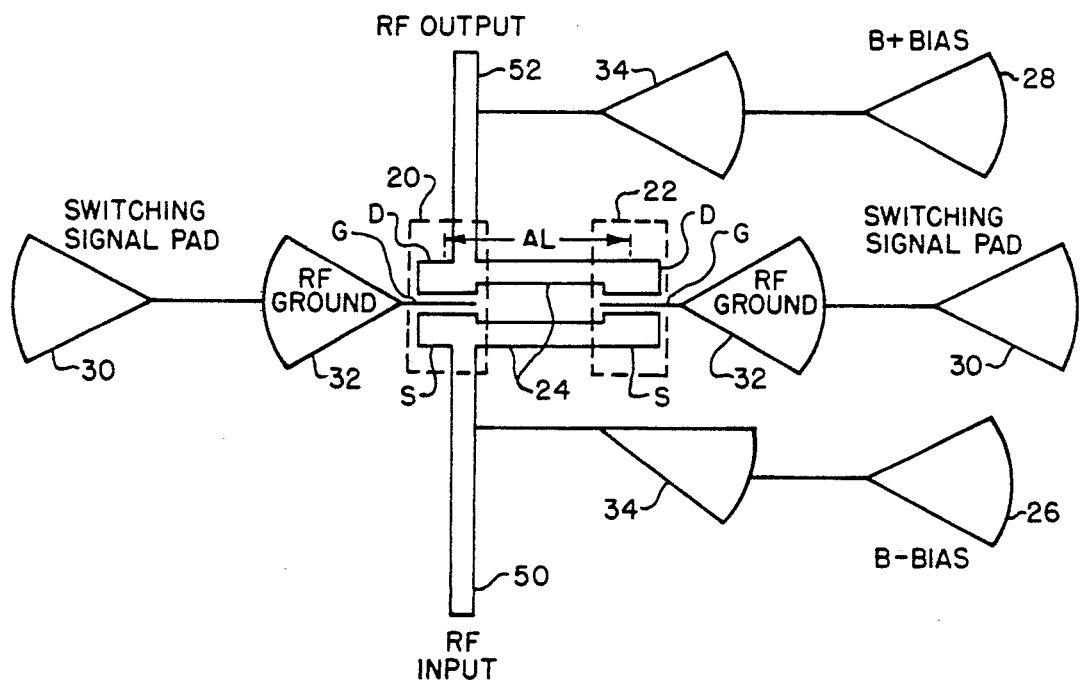
FIG. 5 is a schematic representation of a single gate FET common gate switch path phase shifter apparatus according to the present invention.

Referring now to FIG. 5, there is shown a schematic representation of a single gate identical FET switch path phase shifter apparatus. The digital phase shifter apparatus comprises a pair of single gate FETs 20, 22 which are connected to each other by a transmission line segment 24. The transmission line segment 24 has a predetermined length, $\Delta L$. An RF signal is applied to the source of the FETs 20, 22. A B− bias supply unit 26 provides a negative bias signal to the FET's source. The RF output signal occurs at the drain of the FETs 20, 22. A B+ bias supply unit 28 provides a positive bias signal to the drain of the FETs. The gate of each FET 20, 22 is respectively connected to a signal switching pad unit 30 and an RF ground unit 32. RF ground units 34 which are a quarter wavelength ($\lambda/4$) from the main transmission line are provided at the source and drain of the FETs. The main transmission line comprises input transmission line 50 and output transmission line 52.

The digital phase shifter apparatus utilizes a pair of single gate FETs 20, 22 which are connected in a common gate configuration. The single gate FETs receive an RF ground at their respective gate electrode while a low frequency applied bias (switching signal) can be superimposed on the gate electrodes to cut off the transistor switches when desired. The operating states of the FETs 20, 22 are mutually exclusive, i.e., when one FET is switched on the other FET is switched off and vice versa. The RF signal is connected to the source electrodes of the FETs 20, 22 which are connected by means of a transmission line segment 24. A minimum power reflection or input VSWR will be observed if the reciprocal transconductance (1/gm) of each transistor is approximately equal to the characteristic impedance of the transmission line which is connected to the input. The transmission line segment 24 between the transistors have a differential length difference $\Delta L$ and will provide a differential phase shift that is equal to $2\Delta\theta - 2 \text{TAN}^{-1}[\text{ TAN } \Delta\theta/2]$ where $\Delta\theta = \beta\Delta L$, and $\beta$ is the propagation constant of the RF signal. This digital phase shifter will provide the desired phase shift ($\approx \Delta\theta$), signal gain and minimum signal amplitude modulation if $\Delta\theta$ is less than $\pi/4$.

The present digital phase shifter apparatus is compatible with the currently known and used planar monolithic circuit fabrication techniques. The single gate FET construction will lead to fabrication yield improvement over the dual gate FET circuits. No matching load is needed because of the common gate connection that is employed. The pair of single gate transistors provides the operation characteristics of the dual gate device. Multi-bit digital phase shifters can be fabricated by connecting several basic circuits of the type that are shown in FIG. 5, in cascade with DC blocks between bits.

Although the invention has been described with reference to a particular embodiment, it will be understood by those skilled in the art that the invention is capable of a variety of alternative embodiments within the spirit and scope of the appended claims.

What is claimed is:

1. A digital phase shift apparatus comprising in combination:
   a first and second field effect transistor, said first and second field effect transistor respectively including a single gate, a source and a drain,
   a first transmission line operatively connected to said source of said first field effect transistor, said first transmission line receiving an RF input signal,
   a second transmission line operatively connected to said drain of said first field effect transistor, said second transmission line providing an RF signal output,
   a third transmission line operatively connected between said source of said first field effect transistor and said source of said second field effect transistor,
   a fourth transmission line operatively connected between said drain of said first field effect transistor and said drain of said second field effect transistor,
   a first means for biasing, said first biasing means operatively connected to said first transmission line,
   a second means for biasing, said second biasing means operatively connected to said second transmission line,
   a first signal switch means operatively connected to said gate of said first field effect transistor,
   a second signal switch means operatively connected to said gate of said second field effect transistor, said first signal switch means controlling the operating state of said first field effect transistor, said second signal switch means controlling the operating state of said second field effect transistor, the operating states of said first and second field effect transistors being mutually exclusive, said phase shift apparatus providing a phase-shifted RF signal at said RF signal output when said first field effect transistor is in the OFF operating state and said second field effect transistor is in the ON operating state, the field effect transistor in the ON operating state functioning as both a signal path length switch and a signal amplifier.

2. A digital phase shift apparatus as described in claim 1 wherein said third and fourth transmission lines have the same predetermined length.

3. A digital phase shift apparatus as described in claim 1 wherein said third and fourth transmission lines provide a phase shift equal to $2\Delta\theta - 2 \text{ TAN}^{-1}(\text{ TAN } \Delta\theta/2)$.

4. A digital phase shift apparatus as described in claim 1 wherein said first bias means provides a negative bias signal.

5. A digital phase shift apparatus as described in claim 1 wherein said second bias means provides a positive bias signal.

6. A digital phase shift apparatus as described in claim 1 wherein said third transmission line provides a DC path between the sources of said first and second field effect transistors and said fourth transmission line provides a DC path between the drains of said second field effect transistors.

* * * * *